United States Patent [19]
Oppermann et al.

[11] Patent Number: 5,385,852
[45] Date of Patent: Jan. 31, 1995

[54] METHOD FOR MANUFACTURING VERTICAL MOS TRANSISTORS

[75] Inventors: Klaus-Guenter Oppermann, Holzkirchen; Wolfgang Roesner, Munich; Franz Hofmann, Suenching, all of Germany

[73] Assignee: Siemens Aktiengesellschaft, Munich, Germany

[21] Appl. No.: 163,523

[22] Filed: Dec. 9, 1993

[30] Foreign Application Priority Data

Jan. 14, 1993 [DE] Germany .............................. 4300806

[51] Int. Cl.⁶ ......................................... H01L 21/265
[52] U.S. Cl. ..................................... 437/40; 437/203; 437/67; 437/913; 257/490; 148/DIG. 126
[58] Field of Search ................... 437/40, 67, 203, 183, 437/185, 913, 195; 148/DIG. 126; 257/330–334, 397, 520, 490, 339

[56] References Cited

U.S. PATENT DOCUMENTS

| | | | |
|---|---|---|---|
| 4,191,603 | 3/1980 | Garbarino et al. | 148/187 |
| 4,375,999 | 3/1983 | Nawata et al. | 148/187 |
| 4,584,025 | 4/1986 | Takaoka et al. | 148/1.5 |
| 4,983,535 | 1/1991 | Blanchard | 437/40 |
| 5,141,888 | 8/1992 | Kawayi et al. | 437/33 |
| 5,233,215 | 8/1993 | Baliger | 257/490 |

FOREIGN PATENT DOCUMENTS

55-65463  5/1980  Japan .
1-198076  8/1989  Japan .

OTHER PUBLICATIONS

Wolf, S. "Silicon Processing for the VLSI Era" Lattice Press, Sunset Beach, Calif., vol. 2 (1990) pp. 51–57 and 334–335.
Wolf, S. and R. Tauber "Silicon Processing for the VLSI Era", Lattice Press Sunset Beach, Calif. vol. 1 (1986) pp. 321–323.
Article entitled "An Ultra-Low On-Resistance Power MOSFET Fabricated by Using a Fully Self-Aligned Process" by D. Ueda et al., IEEE vol. ED-34, Apr. 1987 pp. 926–930.
Article entitled "A 55-V, 0.2 m$\Omega$. cm$^2$-Vertical Trench Power MOSFET" by K. Shenai, IEEE Ed Lett. vol. 12, Mar. 1991, pp. 108–110.
Article entitled "500-V n-Channel Insulated-Gate Bipolar Transistor with a Trench Gate Structure", by, H.-R. Chang et al., IEEE Transactions on Electron Devices, vol. 36, No. 9, Sep. 1989, pp. 1824–1829.

*Primary Examiner*—George Fourson
*Assistant Examiner*—David M. Mason

[57] ABSTRACT

For manufacturing vertical MOS transistors, doped regions for a drain (11), well (3), and source (4) are formed in a vertical sequence in a substrate (1). Using a Si$_3$N$_4$ mask (5), trenches (6) are etched perpendicular to the surface of the substrate (1). The trenches isolate the source (4) and well (3) structure, and are filled with doped polysilicon and are closed in an upper region with an insulation structure (8) in self-aligned fashion on the basis of local oxidation. The insulation structure (8) projects laterally beyond the trenches (6). Using the insulation structure (8) as an etching mask, via contact holes (9), that are provided with a metallization for contacting the source (4) and the well (3), are opened down into the well (3) between neighboring trenches (6).

20 Claims, 4 Drawing Sheets

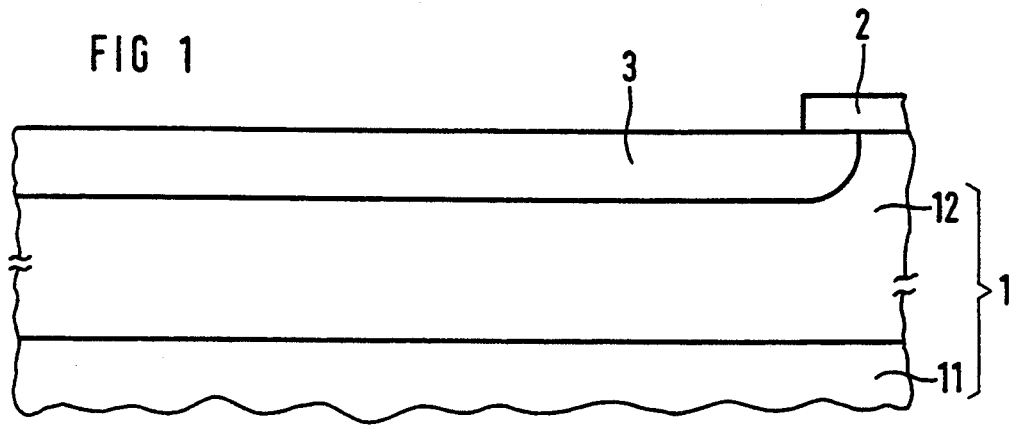
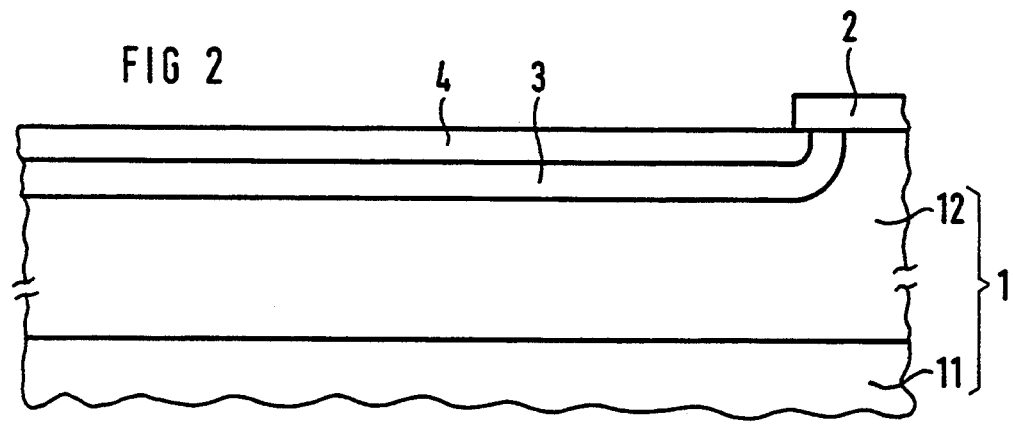
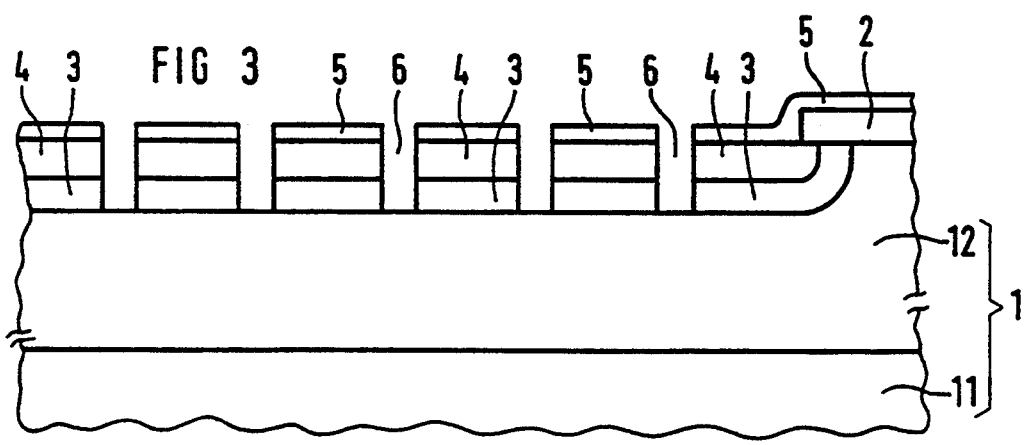

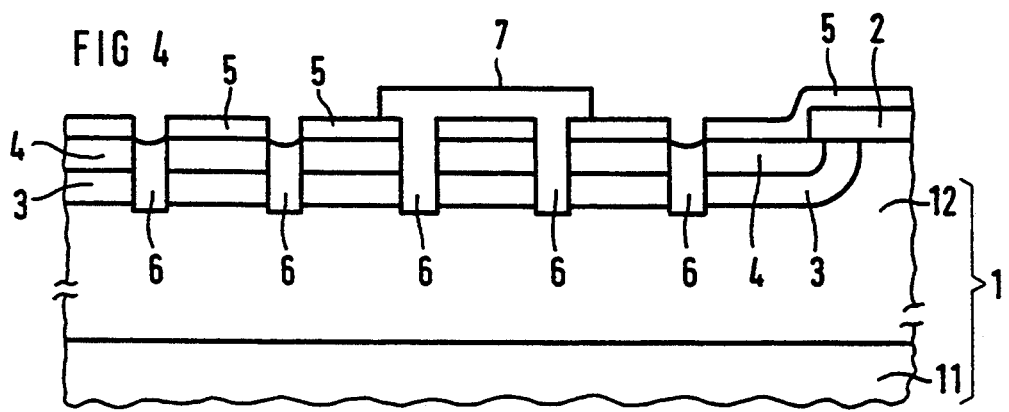
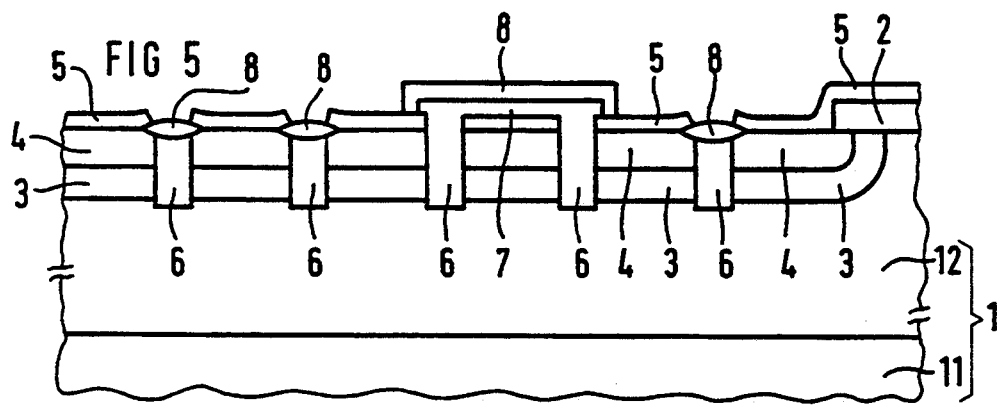
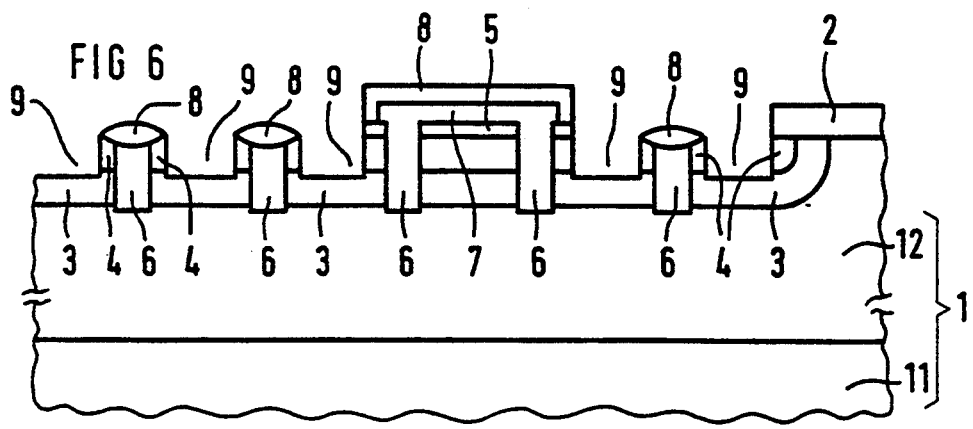

METHOD FOR MANUFACTURING VERTICAL MOS TRANSISTORS

BACKGROUND OF THE INVENTION

An important characteristic of power transistors is the turn-on resistance $R_{DS(on)}$ that can be achieved on a given area $R_{Si}$. In the optimization of a component with respect to component area and thus to cost, the specific turn-on resistance $R_{DS(on)} * R_{Si}$ must be minimized with a given overall resistance of the component. The specific turn-on resistance can be reduced by making the area of the MOS cells smaller in the voltage range below 50 V which, in particular, is of significance in the field of automotive technology.

For reducing the area requirement of the MOS cell, it is known to vertically construct a MOS transistor (see, for example, D. Ueda et al., IEEE Vol. ED-34, 1987, pages 926–930; H.-R. Chang et al., IEEE Vol. ED-36, 1989, pages 1824–1829; K. Shenai, IEEE Ed Lett. Vol. 12, 1991, pages 108–110). The resulting reduction of the space requirement is dependent on the maximum degree of structural fineness that can be achieved in the manufacturing method.

In vertical MOS transistors, source regions that, for example, are n-doped and well regions that, for example, are p-doped are connected to one another with an ohmic contact at the surface of a silicon substrate. The ohmic contact is realized via a metallization at the surface. The gate electrode is arranged in a trench in the vertical MOS transistor and this trench proceeds perpendicularly relative to the surface of the substrate. The drain region is located under source region and the well in the substrate.

D. Ueda et al., IEEE Vol. ED-34, 1987, pages 926–930 discloses that a silicon wafer that, for example, is n+-doped and at whose surface is a small n⁻-doped epitaxial layer can be employed in a method for manufacturing a power MOSFET. By implantation via a mask, a p-doped layer that forms the well is formed in the surface of this substrate. Stripe-shaped source regions that are n+-doped and that proceed parallel to one another are produced in the surface by implantation using a further mask. A part of the p-doped well at the surface of the substrate extends between respectively two neighboring, stripe-shaped source regions. Using a nitride mask, rectangular trenches that extend down into the n⁻-doped epitaxial layer are produced perpendicularly relative to the course of the stripe-shaped source regions. The trenches are likewise arranged in the form of parallel stripes that form a right angle with the stripes of the source regions. The trenches are filled with polysilicon after the production of a gate dielectric. The polysilicon is etched back, whereby the contact area for the MOS gate contact must be covered with a fourth mask. Polysilicon in the upper region of the trenches is converted into $SiO_2$ by local oxidation. An aluminum metallization is applied after removal of a $Si_3N_4$ mask employed for trench etching and for local oxidation and after opening of the contact hole (via hole) to the MOS gate contact area, this aluminum metallization contacting the source regions and the p-doped well regions.

The parts of the p-doped well extending up to the surface of the substrate must have an expanse that at least corresponds to the minimum contact area. This is also valid for the n-doped source regions. Thus, this involves a minimum space requirement at the wafer surface.

Over and above this, parasitic bipolar effects can arise because of the large spacings in the alternating n+-doped source regions and p-doped well regions at the surface of the substrate.

SUMMARY OF THE INVENTION

It is an object of the present invention to provide an improved self-aligned method for the manufacture of vertical MOS transistors with which bipolar effects are avoided in a MOS transistor field manufactured in this way and which, additionally, utilizes one less mask. In particular, the method is suitable for additionally generating the source contact vertically in the component.

In the method of the present invention, regions for the drain, well and source are formed in a vertical sequence in a substrate of silicon. Using a $Si_3N_4$ mask, which can be reinforced by deposited oxide, trenches are etched substantially perpendicularly relative to the surface of the substrate. The trenches are etched to a depth such that they isolate the source and well. The surface of the trenches is provided with a gate dielectric. The trenches are then filled up with doped polysilicon. By local oxidation, an insulation structure is subsequently produced in the upper region of each trench, this insulation structure completely covering the polysilicon in the respective trench and laterally projecting beyond the trenches. After removal of the $Si_3N_4$ mask, a via contact hole is respectively etched between neighboring trenches using the insulation structure as an etching mask, this via contact hole extending down into the well. For contacting of the source and the well, at least the surface of the via contact holes is provided with a metallization.

To what extent the insulation structure laterally projects beyond the trenches is set by the thickness of the resulting $SiO_2$ in the local oxidation. How deep the via contact hole extends into the well is set by the etching time. The contacting of the source and the well therefore ensues self-aligned relative to the $Si_3N_4$ mask. The spacing between neighboring trenches and, thus, the area required per MOS cell can thus be drastically reduced.

A doped region can be formed for the well, and before the source region by implantation through one and the same mask that, for example, is formed of $SiO_2$, by employing a silicon wafer that has a high dopant concentration and at whose surface is arranged an epitaxial layer having a lower dopant concentration of the same conductivity type.

The trenches are preferably part of a contiguous trench structure in which trenches proceeding essentially parallel to the surface of the substrate are arranged grid-like with trenches proceeding transversely relative thereto. Quadrilateral surface elements of the silicon substrate that are limited at all four sides by trench elements are defined in this trench structure. In this way, MOS cells are formed that are surrounded self-aligned by the gate electrode on all four sides and by the insulation structure arranged at their surface. The trenches are all connected to one another, so that the gate electrode can be connected via a single contact.

For filling the trenches, a conductivity polysilicon layer is applied, particularly surface-wide, and is doped by drive-out from a doped phosphorus glass layer. Subsequently, the polysilicon layer is etched back, whereby the surface of the $Si_3N_4$ mask is uncovered. Before the re-etching of the polysilicon layer, it is advantageous to produce a mask that covers a contiguous surface element of the polysilicon layer that extends over a plurality of neighboring trenches. A polysilicon surface is preserved in this region when etching back the polysilicon layer. This is oxidized at the surface in the local oxidation. A via contact hole by means of which a contact to the contiguous gate electrode is formed can be opened later on this polysilicon surface. As a result thereof, the contact to the gate electrode can also be easily produced in instances wherein the trench width and, thus, the width of the gate electrode is extremely small.

It lies within the framework of the present invention to introduce dopant of the same conductivity type as the well into the surface of the via contact holes before the application of the metallization. The contact resistance to the well is improved in this way. Moreover, this via contact hole implantation leads to a modification of the well structure. The location of the maximum field strength given an avalanche breakdown can be shifted away from the trench and, thus, away from the gate dielectric into the volume. A planar structure is achieved by completely filling the via contact holes with the metallization.

It lies within the framework of the present invention to contact the drain region by a terminal region proceeding from the surface of the substrate. The drain region can thus be both the original silicon wafer having an appropriate doping as well as a buried layer in the substrate. This embodiment of the present invention makes the MOS transistor manufactured according to the method integratable.

Further developments of the present invention are as follows.

A first doped region of a first conductivity type is produced in the substrate as the drain. A second doped region of the first conductivity type that has a lower dopant concentration than the first doped region is produced above the first doped region. A third region that is doped with a second conductivity type opposite the first conductivity type and which forms the well is formed above the second region by implantation using a mask. A fourth doped region of the first conductivity type which has a higher dopant concentration than the second doped region is produced above the third doped region as the source by implantation through the same mask. The trenches extend into the second doped region. In one embodiment of the present invention the mask for the implantation is formed of $SiO_2$.

The trenches are part of a contiguous trench structure wherein trenches proceeding essentially parallel to the surface of the substrate are arranged grid-like with trenches proceeding transversely relative thereto and define quadrilateral or hexagonal surface elements.

The polysilicon in the trenches is doped by deposition of an undoped conformal polysilicon layer that is doped by drive-out from a doped phosphorus glass layer and is formed by subsequent re-etching of the polysilicon layer, whereby the surface of the $Si_3N_4$ mask is uncovered.

A photoresist mask that covers a contiguous surface element of the polysilicon layer that extends over at least two neighboring trenches is produced before the etching back of the polysilicon layer.

Dopant of the second conductivity type is introduced into the surface of the via contact holes before the application of the metallization.

The via contact holes are completely filled up with the metallization.

The drain region is produced as a buried layer in the substrate. A terminal region for contacting the drain region proceeding from the surface of the substrate is formed to the side of source and well.

A further via contact hole to the polysilicon in the trenches is opened in the insulation structure after the production of the via contact holes between neighboring trenches.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows the manufacture of a well using a mask;

FIG. 2 shows the manufacture of a source region using the same mask;

FIG. 3 shows the manufacture of trenches using a $Si_3N_4$ mask;

FIG. 4 shows the filling of the trenches with polysilicon;

FIG. 5 shows the manufacture of insulation structures by local oxidation;

FIG. 6 shows the manufacture of via contact holes using the insulation structure as an etching mask;

DESCRIPTION OF THE PREFERRED EMBODIMENT

Figure 7:
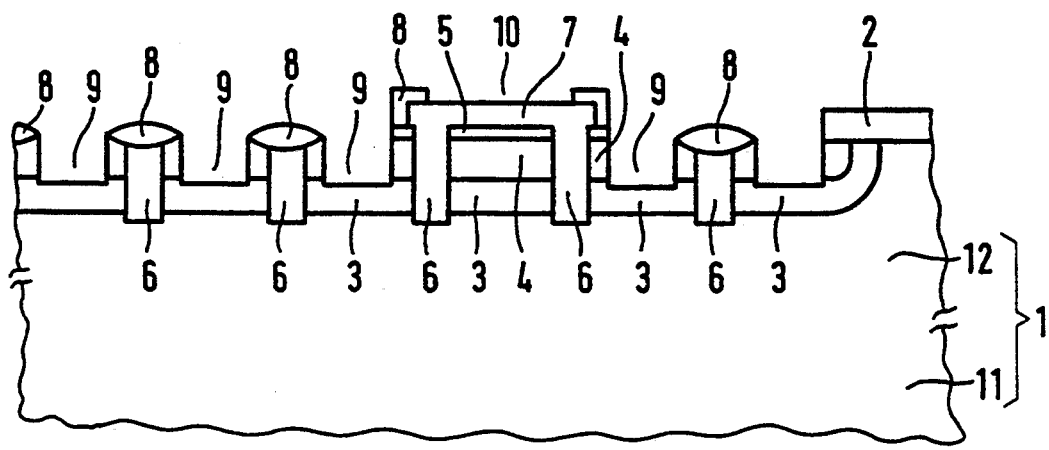
FIG. 7 shows the opening of a via contact hole to the gate electrode.

A n-doped epitaxial layer 12 that, for example, is 5 $\mu m$ thick is deposited onto a highly doped, for example n+-doped silicon wafer 11. The silicon wafer 11 has a dopant concentration of, for example, $1 \times 10^{19}$ cm$^{-3}$. The epitaxial layer 12 has a dopant concentration of, for example, $10^{16}$ cm$^{-3}$. The silicon wafer 11 and the epitaxial layer 12 together form a substrate 1 (see FIG. 1).

A $SiO_2$ layer that, for example, is 800 nm thick is deposited onto the surface of the substrate 1, this being structured using a first phototechnique as mask 2. A p-doped well 3 is formed by implantation and drive-in borons using the mask 2 as an implantation mask. Subsequently, an arsenic implantation and a further-drive-in step are implemented using the same mask 2 as an implantation mask. As a result thereof, a source region 4 is formed (see FIG. 2). The source region has a dopant concentration of, for example, $C_s = 1 \times 10^{20}$ cm$^{-3}$. The well 3 has a dopant concentration of $C_s = 5 \times 10^{16}$ cm$^{-3}$.

Subsequently, a $Si_3N_4$ layer is deposited surface-wide and structured, to produce a $Si_3N_4$ mask 5 (see FIG. 3). A trench etching is implemented using the $Si_3N_4$ mask 5 as an etching mask. Trenches 6 result that isolate the source region 4 and the well 3 and that extend down into the epitaxial layer 12. The trenches 6 form a grid-shaped trench structure parallel to the surface of the substrate 1 in which, for example, respectively four trenches define a quadrilateral area that is limited by the four trenches. The etching of the trenches ensues, for example, by dry etching with HBr, He, $O_2$, $NF_3$.

A gate dielectric of $SiO_2$ (not shown) is produced at the surface of the trenches, for example by oxidation. Subsequently, a polysilicon layer is deposited surface-wide and doped. The doping ensues, for example, by drive-out from a doped phosphorus glass layer deposited thereabove.

A photoresist mask (not shown) is formed, and, for example, covers two neighboring trenches and a contiguous polysilicon region arranged therebetween. The polysilicon layer is etched back by dry etching (HBr, $Cl_2$, $C_2F_6$), so that the trenches 6 remain filled with polysilicon up to the surface of the source region 4. The polysilicon region arranged under the photoresist mask thereby remains at the surface of the two neighboring trenches 6, as well as the part of the $Si_3N_4$ mask 5 arranged between the two neighboring trenches 6. A polysilicon web 7 covering both trenches arises in this manner (see FIG. 4).

After the removal of the photoresist mask, the uncovered polysilicon is locally oxidized in a thermal oxidation, whereby an insulation structure 8 arises (see FIG. 5. The insulation structure 8 has lens-shaped elements that are respectively arranged in the upper region of a trench. These lens-shaped elements of the insulation structure 8 project laterally beyond the respective trench. The length of the projection is set by the thickness of the lens-shaped element and, thus, by the duration of the local oxidation. The insulation structure comprises a $SiO_2$ web at the surface of the polysilicon web 7.

Via contact holes 9 that extend down into the well 3 are formed using the insulation structure 8 as an etching mask (see FIG. 6). The via contact holes 9 thereby isolate the source regions 4. The etching ensues, for example, with HBr, He, $O_2$, $NF_3$. The width of the via contact holes 9 is set via the thickness of the lens-shaped oxide structures.

In order to improve the contact resistance of the well 3, a via contact hole implantation with boron can be subsequently implemented. The boron concentration in the well 3 is thereby increased in the surface of the via contact hole 9. This also leads to a modification of the p-well structure that has a beneficial influence on the switching behavior of the component.

Figure 8:
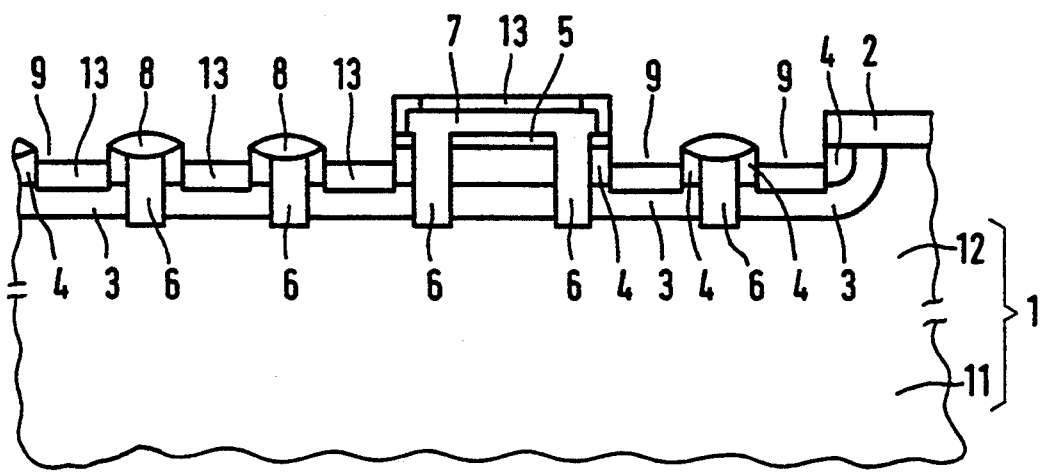
FIG. 8 shows the introduction of metallization into the via contact holes.

A further via contact hole 10 to the polysilicon web 7 opened above the polysilicon web 7 with a further phototechnique (not shown; see FIG. 7). Finally, metallizations 13 are produced in the via contact holes 9 and in the via contact hole 10 (see FIG. 8). The metallizations 13 in the via contact holes 9 form a contact between the respective source region 4 and the well 3. They are composed, for example, of Ti/TiN and aluminum.

Figure 9:
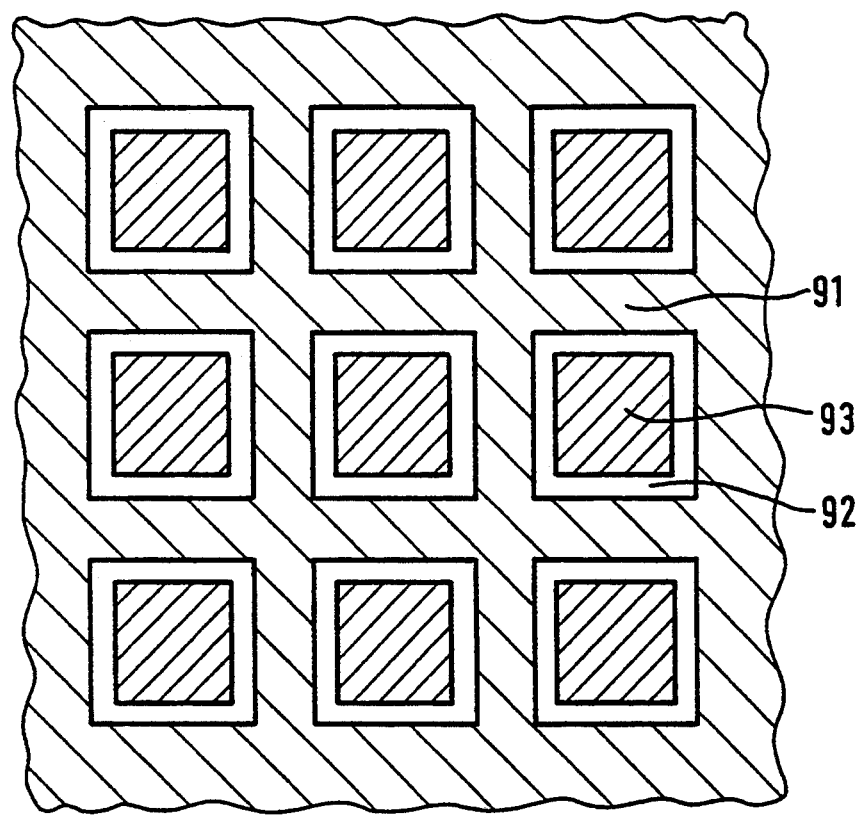
FIG. 9 shows a portion of a cell field that was manufactured according to the method of the present invention.

FIG. 9 shows a portion of a MOS cell field that was manufactured according to the method of the present invention.

In typical applications, such cell fields have $6.25 \times 10^6$ elements per $cm^2$. The trenches in the cell field are part of a trench structure 91 that defines the quadrilateral surface elements. Each of the quadrilateral surface elements is thereby completely surrounded by four trenches. The trench structure 91 is filled up with doped polysilicon. Each of the surface elements has a source region 92 along the edge of the trench structure 91. The source region 92 is respectively limited by a contact 93 at the side facing away from the trench structure 91. This contact 93 fills a via contact hole. Each of the surface elements accepts one MOS cell.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing vertical MOS transistors, comprising the steps of:
    forming doped regions for a drain, well and source in a vertical sequence in a substrate of silicon;
    etching trenches that isolate the source and well substantially perpendicularly relative to a surface of the substrate using a $Si_3N_4$ mask;
    providing the surface of the trenches with a gate dielectric and filling up the trenches with a doped polysilicon;
    producing insulation structures by local oxidation in upper regions of respective trenches upon employment of the $Si_3N_4$ mask as an oxidation mask, each of said insulation structures completely covering the polysilicon in a respective trench and laterally projecting beyond the respective trench so that said insulation structures are partly arranged above portions of the source neighboring respective trenches;
    removing the $Si_3N_4$ mask;
    etching via contact holes that extend into the well between neighboring trenches and using the insulation structure as an etching mask; and
    providing a metallization at least on a surface of the via contact holes for contacting the source and well.

2. The method according to claim 1, wherein the method further comprises:
    producing a first doped region of a first conductivity type in the substrate as the drain;
    producing a second doped region of the first conductivity type, that has a lower dopant concentration than the first doped region, above the first doped region;
    producing a third doped region, that is doped with a second conductivity type opposite said first conductivity type and which forms the well, above the second region by implantation using a mask;
    producing a fourth doped region of the first conductivity type, which has a higher dopant concentration than the second doped region, above the third doped region as the source by implantation through the same mask; and
    extending the trenches into the second doped region.

3. The method according to claim 2, wherein the mask for the implantation is formed of $SiO_2$.

4. The method according to claim 1, wherein the trenches are part of a contiguous trench structure wherein a first set of trenches proceeding essentially parallel to the surface of the substrate are arranged grid-like with at least a second set of trenches that crosses said first set of trenches and define one of quadrilateral and hexagonal surface elements.

5. The method according to claim 1, wherein the method further comprises doping the polysilicon in the trenches by deposition of an undoped conformal polysilicon layer that is doped by drive-out from a doped phosphorus glass layer and is formed by subsequent etching back of the polysilicon layer, whereby the surface of the Si$_3$N$_4$ mask is uncovered.

6. The method according to claim 5, wherein the method further comprises producing a photoresist mask that covers a contiguous surface element of the polysilicon layer that extends over at least two neighboring trenches before the etching back of the polysilicon layer.

7. The method according to claim 1, wherein the method further comprises introducing dopant of the second conductivity type into the surface of the via contact holes before the application of the metallization.

8. The method according to claim 1, wherein the method further comprises completely filling up the via contact holes with the metallization.

9. The method according to claim 1, wherein the method further comprises:
producing the drain region as a buried layer in the substrate; and
forming a terminal region from the surface of the substrate through the source and well for contacting the drain region.

10. The method according to claim 1, wherein the method further comprises opening a further via contact hole to the polysilicon in the trenches in the insulation structure after the production of the via contact holes between neighboring trenches.

11. A method for manufacturing vertical MOS transistors, comprising the steps of:
providing a substrate of silicon;
producing a first doped region of a first conductivity type in the substrate as a drain;
producing a second doped region of the first conductivity type, that has a lower dopant concentration than the first doped region, above the first doped region;
producing a third doped region, that is doped with a second conductivity type opposite said first conductivity type and which forms a well, above the second region by implantation using a mask;
producing a fourth doped region of the first conductivity type, which has a higher dopant concentration than the second doped region, above the third doped region as a source by implantation through the same mask;
etching trenches that isolate the source and well and that extend substantially perpendicularly relative to a surface of the substrate into the second doped region using a Si$_3$N$_4$ mask;
providing the surfaces of the trenches with a gate dielectric and filling up the trenches with a doped polysilicon;
producing insulation structures by local oxidation in upper regions of respective trenches upon employment of the Si$_3$N$_4$ mask as an oxidation mask, each of said insulation structures completely covering the polysilicon in a respective trench and laterally projecting beyond the respective trench so that said insulation structures are partly arranged above portions of the source neighboring respective trenches;
removing the Si$_3$N$_4$ mask;
etching via contact holes that extend into the well between neighboring trenches and using the insulation structure as an etching mask; and
providing a metallization at least on a surface of the via contact holes for contacting the source and well.

12. A method for manufacturing vertical MOS transistors, comprising the steps of:
forming doped regions for a drain, well and source in a vertical sequence in a substrate of silicon;
etching trenches that isolate the source and well substantially perpendicularly relative to a surface of the substrate using a Si$_3$N$_4$ mask to produce a trench structure wherein a first set of trenches are arranged grid-like with at least a second set of trenches that crosses said first set of trenches;
providing the surfaces of the trenches with a gate dielectric and filling up the trenches with a doped polysilicon;
producing insulation structures by local oxidation in upper regions of respective trenches upon employment of the Si$_3$N$_4$ mask as an oxidation mask, each of said insulation structures completely covering the polysilicon in a respective trench and laterally projecting beyond the respective trench so that said insulation structures are partly arranged above portions of the source neighboring respective trenches;
removing the Si$_3$N$_4$ mask;
etching via contact holes that extend into the well between neighboring trenches after the removal of the Si$_3$N$_4$ mask and using the insulation structure as an etching mask; and
providing a metallization at least on a surface of the via contact holes for contacting the source and well.

13. The method according to claim 12, wherein the method further comprises:
producing a first doped region of a first conductivity type in the substrate as the drain;
producing a second doped region of the first conductivity type, that has a lower dopant concentration than the first doped region, above the first doped region;
providing a third doped region, that is doped with a second conductivity type opposite said first conductivity type and which forms the well, above the second region by implantation using a mask;
producing a fourth doped region of the first conductivity type, which has a higher dopant concentration than the second doped region, above the third doped region as the source by implantation through the same mask; and
extending the trenches into the second doped region.

14. The method according to claim 13, wherein the mask for the implantation is formed of SiO$_2$.

15. The method according to claim 12, wherein the method further comprises doping the polysilicon in the trenches by deposition of an undoped conformal polysilicon layer that is doped by drive-out from a doped phosphorus glass layer and is formed by subsequent etching back of the polysilicon layer, whereby the surface of the Si$_3$N$_4$ mask is uncovered.

16. The method according to claim 15, wherein the method further comprises producing a photoresist mask that covers a contiguous surface element of the polysilicon layer that extends over at least two neighboring trenches before the etching back of the polysilicon layer.

17. The method according to claim 12, wherein the method further comprises introducing dopant of the second conductivity type into the surface of the via contact holes before the application of the metallization.

18. The method according to claim 12, wherein the method further comprises completely filling up the via contact holes with the metallization.

19. The method according to claim 12, wherein the method further comprises:
producing the drain region as a buried layer in the substrate; and
forming a terminal region from the surface of the substrate to a side of the source and well for contacting the drain region.

20. The method according to claim 12, wherein the method further comprises opening a further via contact hole to the polysilicon in the trenches in the insulation structure after the production of the via contact holes between neighboring trenches.

* * * * *